United States Patent
Murahashi

(10) Patent No.: US 8,988,909 B2
(45) Date of Patent: Mar. 24, 2015

(54) POWER CONVERSION DEVICE

(75) Inventor: Akihiro Murahashi, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 275 days.

(21) Appl. No.: 13/581,117

(22) PCT Filed: Feb. 25, 2010

(86) PCT No.: PCT/JP2010/052980
§ 371 (c)(1),
(2), (4) Date: Sep. 21, 2012

(87) PCT Pub. No.: WO2011/104848
PCT Pub. Date: Sep. 1, 2011

(65) Prior Publication Data
US 2013/0003429 A1    Jan. 3, 2013

(51) Int. Cl.
*H02M 7/68* (2006.01)
*H02M 7/48* (2006.01)
*B60L 3/00* (2006.01)
(Continued)

(52) U.S. Cl.
CPC .............. *H02M 7/48* (2013.01); *B60L 3/0046* (2013.01); *B60L 3/0069* (2013.01); *B60L 9/22* (2013.01); *G01R 31/025* (2013.01); *G01R 31/028* (2013.01); *H02H 7/16* (2013.01);
(Continued)

(58) Field of Classification Search
USPC ............. 363/21.07, 34–41, 56.01, 65, 89, 95, 363/127, 132; 318/698, 801, 811
See application file for complete search history.

(56) References Cited

U.S. PATENT DOCUMENTS 4,758,771 A * 7/1988 Saito et al. .................... 318/729
6,713,888 B2 * 3/2004 Kajiura ........................ 290/40 F
(Continued)

FOREIGN PATENT DOCUMENTS

JP   4-127868 A      4/1992
JP   5-252755 A *    9/1993
(Continued)

OTHER PUBLICATIONS

International Search Report (PCT/ISA/210) issued on May 18, 2010, by the Japanese Patent Office as the International Searching Authority for International Application No. PCT/JP2010/052980.
(Continued)

*Primary Examiner* — Rajnikant Patel
(74) *Attorney, Agent, or Firm* — Buchanan Ingersoll & Rooney PC

(57) ABSTRACT

A power conversion device includes a main circuit unit (direct-current main circuit) that converts direct-current power into alternating-current power, and a control unit that controls the direct-current main circuit. The direct-current main circuit includes a voltage detector (detector) that detects a capacitor voltage and a discharge circuit that discharges energy accumulated in a capacitor. The control unit includes a detection circuit that estimates a capacitor voltage during a normal operation based on a voltage transmitted from the voltage detector in a state where the main circuit unit is disconnected from a power supply and that detects a sign that a short circuit fault occurs in the capacitor, and a control circuit that outputs a control signal for controlling the discharge circuit to operate when the control circuit receives a detection signal from the detection circuit.

10 Claims, 3 Drawing Sheets

(51) Int. Cl.
  *B60L 9/22* (2006.01)
  *G01R 31/02* (2006.01)
  *H02H 7/16* (2006.01)
  *H02M 1/32* (2007.01)
  *G01R 31/42* (2006.01)

(52) U.S. Cl.
  CPC .......... *H02M2001/322* (2013.01); *G01R 31/42* (2013.01); *B60L 2200/26* (2013.01)
  USPC ............................................. 363/89; 363/132

(56) References Cited

U.S. PATENT DOCUMENTS

| | | | | |
|---|---|---|---|---|
| 6,912,108 | B2* | 6/2005 | Erixon | 361/16 |
| 7,837,011 | B2* | 11/2010 | Takasaki et al. | 187/296 |
| 2003/0052544 | A1* | 3/2003 | Yamamoto et al. | 307/66 |

FOREIGN PATENT DOCUMENTS

| | | | |
|---|---|---|---|
| JP | 6-165523 | A | 6/1994 |
| JP | 8-031690 | A | 2/1996 |
| JP | 8-140257 | A | 5/1996 |
| JP | 11-215808 | A | 8/1999 |
| JP | 2004-056956 | * | 2/2004 |
| JP | 2004-056956 | A | 2/2004 |

OTHER PUBLICATIONS

Written Opinion (PCT/ISA/237) issued on May 18, 2010, by the Japanese Patent Office as the International Searching Authority for International Application No. PCT/JP2010/052980.

Chinese Office Action dated May 14, 2014 issued in corresponding Chinese Patent Appln. No. 201080064657.4 with English translation (13 pages).

\* cited by examiner

POWER CONVERSION DEVICE

FIELD

The present invention relates to a power conversion device that includes a direct-current (DC) circuit unit.

BACKGROUND

A power conversion device that includes a DC circuit unit includes a filter capacitor intended to smooth a DC voltage for stably controlling the device and to suppress a generated harmonic current. Generally, a film capacitor is used as this filter capacitor. This film capacitor generally contains flammable mineral oil or vegetable oil inside of a case. Because this oil has a possibility of ignition and the film is also flammable, it is necessary to provide a protection mechanism such as a fuse so as to prevent the ignition.

A conventional power conversion device is intended to improve safety and to make the device downsized and lightweight by adopting a filter capacitor provided with segment fuse mechanisms or the like. If a short circuit occurs between films due to an external factor such as an overvoltage or an internal factor such as a defect in the film itself, one of these segment fuse mechanisms is operated by a flowing short-circuit current, only a segment to which the short circuit occurs is separated from the other segments. The capacitor maintains to function by the remaining faultless segments and functions to prevent the rupture of a capacitor case and ignition (for example, Patent Literature 1 mentioned below).

Furthermore, Patent Literature 2 mentioned below proposes a protection device that includes detection means for detecting a short circuit that occurs in a capacitor provided in a DC main circuit of a power converter as means for preventing explosion resulting from a short circuit of the capacitor, that turns on a switch connected in parallel to this capacitor, and that prevents a short-circuit current from flowing to the fault capacitor.

CITATION LIST

Patent Literatures

Patent Literature 1: Japanese Patent Application Laid-open No. H8-31690 (paragraph [0015], FIG. 2, and FIG. 4)

Patent Literature 2: Japanese Patent Application Laid-open No. H8-140257 (paragraph [0008] and FIG. 1)

SUMMARY

Technical Problem

However, the power conversion device described in Patent Literature 1 mentioned above has the following problems. That is, when the temperature of the filter capacitor rises and the temperature of the films exceeds a heatproof temperature depending on excessive temperature conditions used for an ambient temperature equal to or higher than an allowable temperature or depending on conditions of overload at which a ripple current equal to or higher than a permissible value flows, the protection made by the fuse mechanisms does not function sufficiently and a short circuit fault occurs, possibly resulting in the rupture of the capacitor case or a fire. Furthermore, in the power conversion device described in Patent Literature 1 mentioned above, even when the filter capacitor is used within the range of an operating temperature, the fuse mechanisms do not operate normally when the segment fuses are not manufactured properly because of a manufacturing fault or the like of the capacitor. This may cause a problem that a short circuit fault is generated, a capacitor case is damaged, and flammable oil is ignited and it results in a fire.

Furthermore, in the power conversion device that includes means for detecting a short circuit that occurs in a capacitor as described in Patent Literature 2 mentioned above, a switch connected in parallel to the fault capacitor is turned on so as to prevent a short-circuit current from flowing to the fault capacitor. However, there is a problem that Patent Literature 2 has no description about a specific method as for means for detecting occurrence of a short circuit to individual capacitors.

The present invention has been achieved to solve the above problems, and an object of the present invention is to provide a power conversion device that can prevent a short circuit fault in a capacitor in advance.

Solution to Problem

In order to attain the above object, a power conversion device of the present invention includes a direct-current main circuit that converts direct-current power into alternating-current power, and a control unit that controls the direct-current main circuit. The direct-current main circuit includes: a capacitor that constitutes the direct-current main circuit, a detector that detects a voltage of the capacitor, and a first discharge circuit that includes the capacitor and a first resistor, and that discharges electric charge accumulated in the capacitor via the first resistor. The control unit includes a detection circuit that compares a transition of a voltage estimated based on an initial voltage detected by the detector at a time of disconnecting the direct-current main circuit from a power supply and on a time constant of the first discharge circuit with a transition of a voltage detected by the detector, and that generates a detection signal indicating a sign that a short circuit fault occurs in the capacitor.

Advantageous Effects of Invention

According to the present invention, a voltage transition estimated based on an initial voltage detected by a detector when a direct-current main circuit is disconnected from a power supply and a predetermined time constant is compared with a transition of a voltage detected by a detector, and a detection signal indicating a sign of occurrence of a short circuit fault in a capacitor is generated. Therefore, it is possible to prevent a short circuit fault from occurring in the capacitor in advance.

DESCRIPTION OF EMBODIMENTS

Exemplary embodiments of a power conversion device according to the present invention will be explained below in detail with reference to the accompanying drawings. The present invention is not limited to the embodiments.

First Embodiment

Figure 1:
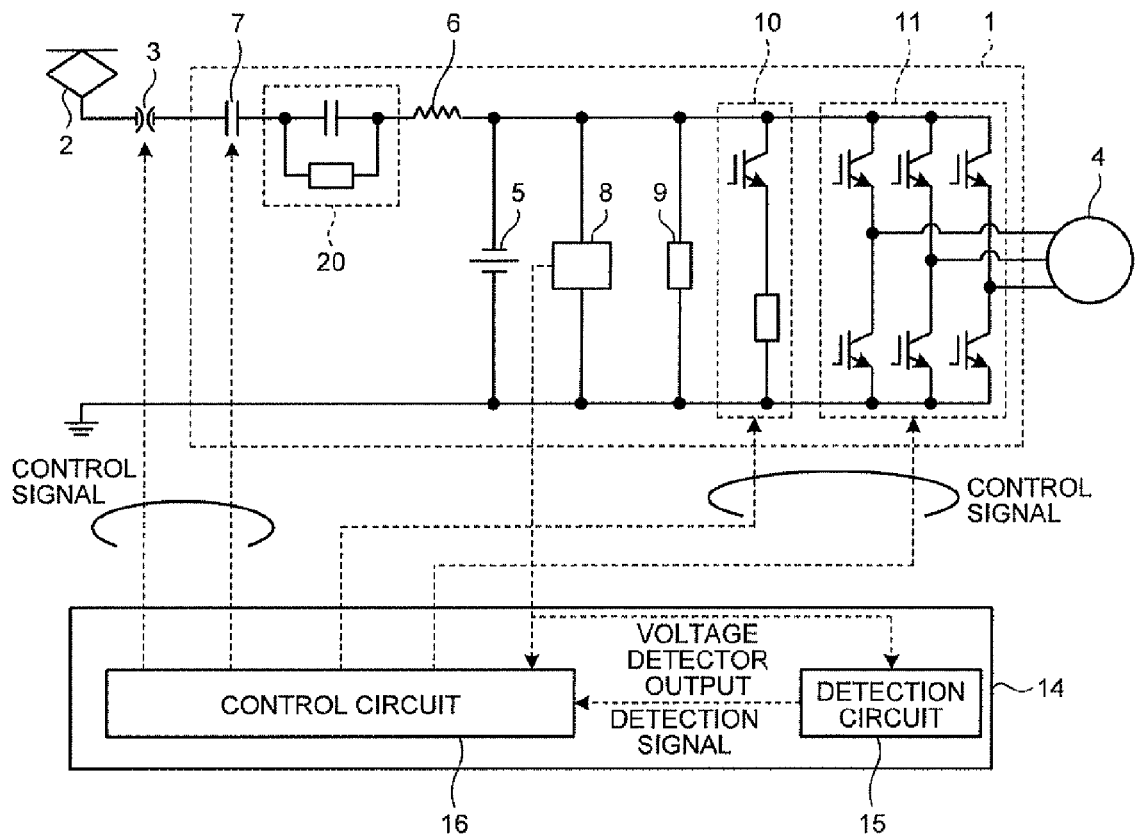
FIG. 1 is a configuration diagram of a power conversion device according to a first embodiment of the present invention.
Figure 2:
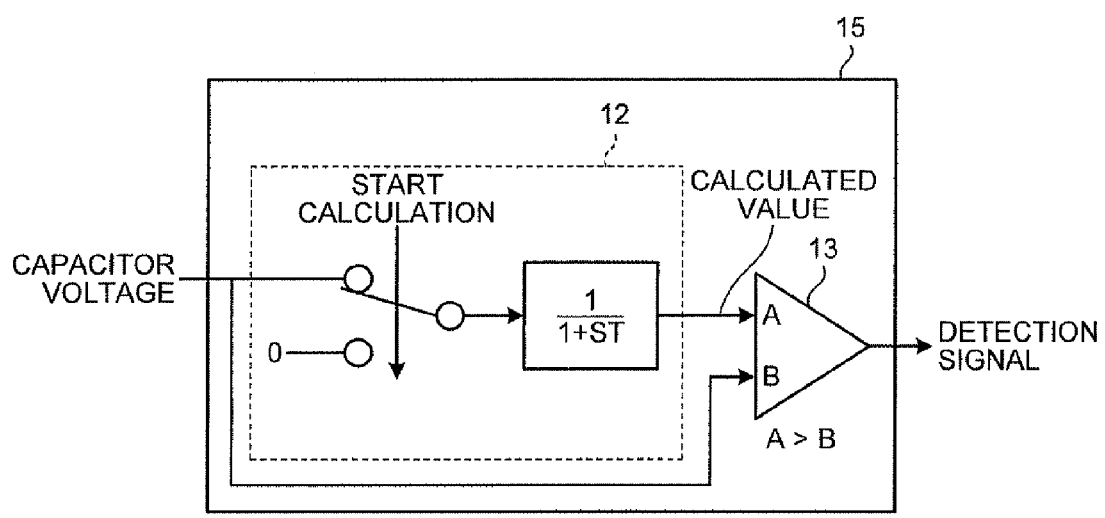
FIG. 2 is a configuration diagram of a detection circuit that is applied to the power conversion device according to the first embodiment of the present invention.
Figure 3:
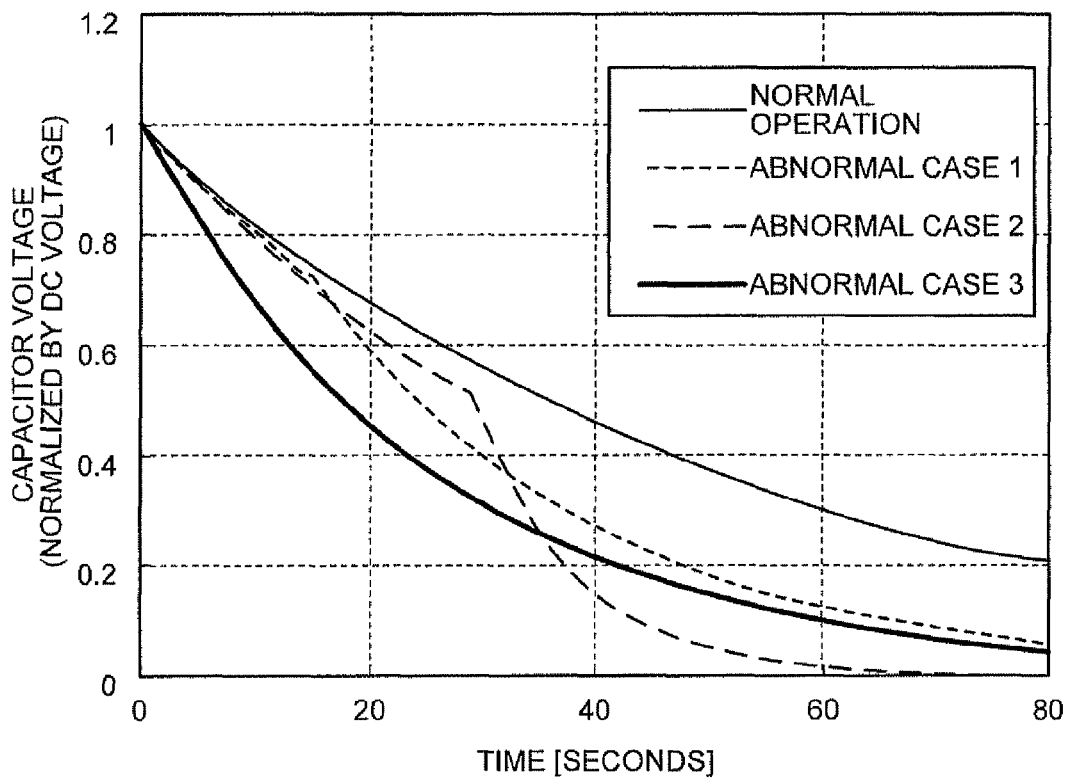
FIG. 3 depicts a result of comparison between a transition of a capacitor voltage when a capacitor is normal and a transition of a capacitor voltage when the capacitor is abnormal.

FIG. 1 is a configuration diagram of a power conversion device according to a first embodiment of the present invention, FIG. 2 is a configuration diagram of a detection circuit that is applied to the power conversion device according to the first embodiment of the present invention, and FIG. 3 depicts a result of comparison between a transition of a capacitor voltage when a capacitor is normal and a transition of a capacitor voltage when the capacitor is abnormal.

In FIG. 1, the power conversion device is configured to include, as main constituent elements, a DC main circuit unit 1 and a control unit 14. The main circuit unit 1 is configured to include a second switch 7, an inrush-current suppression unit 20, a filter reactor 6, a filter capacitor (hereinafter, simply "capacitor") 5, a voltage detector 8, a discharge circuit 10, and a power conversion circuit 11.

One end of a first switch 3 is connected to a power collector 2 such as a pantograph, and the other end of the first switch 3 is connected to an input side of the main circuit unit 1. The first switch 3 is a switch that is operated at a high speed to disconnect a power system of the power collector 2 from that of the main circuit unit 1 when an abnormality such as an earth fault occurs to the power conversion device. A load 4 such as an induction motor is connected to an output side of the main circuit unit 1, and the main circuit unit 1 controls the load 4 to be driven. The main circuit unit 1 and the first switch 3 are controlled in response to control signals from the control unit 14.

Functions of the constituent elements of the main circuit unit 1 are explained next. The second switch 7 connects or releases an input-side circuit of the main circuit unit 1, that is, the inrush-current suppression unit 20 to or from the power collector 2 in response to the control signal from a control circuit 16. The inrush-current suppression unit 20, which is constituted by a resistor and a switch, suppresses a current from an aerial line at a timing at which the switch is operated. The capacitor 5 and the filter reactor 6 constitute a filter circuit and smoothes a DC voltage. A capacity of the capacitor 5 is normally from several millifarads to several tens of millifarads. The voltage detector 8 monitors a voltage of the capacitor 5 so as to stably control the power conversion device. A discharge resistor (first resistor) 9 discharges energy that is accumulated in the capacitor 5 when the second switch 7 is turned off and the device stops operating. The discharge resistor 9 is a component for ensuring safety, and a resistance of the discharge resistor 9 is set so that an electric-discharge time constant of the capacitor 5 is several tens of seconds to several minutes. That is, a first discharge circuit that is constituted by the capacitor 5 and the discharge resistor 9 is configured to discharge electric charge accumulated in the capacitor 5. The discharge circuit (second discharge circuit) 10 is a protection device that promptly discharges the energy accumulated in the capacitor and decreases the voltage of the capacitor 5 when a detection circuit 15 detects an abnormality. That is, the discharge circuit 10 includes a resistor (second resistor) and is configured to discharge the electric charge accumulated in the capacitor 5.

The capacitor 5 normally includes a protection mechanism such as a segment fuse mechanism. When a film temperature rises due to an operation failure of this protection mechanism, overload, or the like, then insulating performance degrades as a result of an excess of the film temperature over a heatproof temperature, which often results in a large-scale short circuit fault in the end. Because the capacity of the capacitor 5 adopted in the power conversion device is several millifarads to several tens of millifarads and the DC voltage to be used is within a range from 600 volts to 4000 volts, the energy accumulated in the capacitor 5 is several kilojoules to several tens of kilojoules.

The power conversion device is connected to a power supply source such as an aerial line. Accordingly, when a short circuit occurs in the capacitor 5, energy also flows in the power conversion device from the aerial line. Normally, an overcurrent protection mechanism included in the power conversion device can discharge energy accumulated in the capacitor 5 of the power conversion device and energy flowing from the power supply source before the first switch 3 is turned off, that is, energy of several tens of kilojoules in all from the fault capacitor even if the first switch 3 is turned off. As a result, rupture of a capacitor case or ignition of internal oil or films possibly occurs. Even when a short circuit fault occurs in the capacitor 5 while the first switch 3 is turned off and the power conversion device is disconnected from the aerial line, the rupture of the case or the ignition possibly occurs because the energy accumulated in the capacitor 5 is discharged during a short circuit fault. Therefore, it is necessary to discharge the energy accumulated in the capacitor 5 before a short circuit occurs by recognizing a sign of the short circuit that occurs in the capacitor 5 so as to prevent the rupture of the case and the ignition.

A result of a verification experiment confirmed that a decrease in impedance of the capacitor 5 occurred as a sign of the short circuit that occurs in the capacitor 5. When a short circuit fault occurs, the temperature of the film to which the short circuit occurs rises. It is considered that degraded insulating characteristics resulting from this temperature rise causes the decrease in the impedance. This decrease in the impedance appears as a phenomenon that an electric-discharge time constant for the capacitor voltage decreases when the second switch 7 is turned off in the power conversion device that includes the discharge resistor 9, as shown in voltage waveforms of FIG. 3. A solid line represents a capacitor voltage that is obtained by a product between the electric charge of the capacitor 5 and the resistance of the discharge resistor 9 and that corresponds to the electric-discharge time constant when the second switch 7 is turned off. A broken line represents a capacitor voltage when the electric-discharge time constant decreases according to the decrease in the impedance. For example, the result of the experiment confirmed that the resistance in the order of megaohms at the time the capacitor 5 was normal decreased to several kiloohms when the capacitor 5 was abnormal.

The power conversion device according to the embodiment of the present invention can prevent the occurrence of a short circuit fault in the capacitor 5 and prevent the subsequent occurrence of the rupture of the capacitor case and a fire by detecting the sign before the short circuit occurs in the capacitor 5. Because the sign before the short circuit occurs in the capacitor 5 appears as an abnormal decrease in the capacitor voltage, it is possible to protect the capacitor 5 by monitoring the voltage of the capacitor 5, causing the detection circuit 15 to detect the abnormal decrease in the capacitor voltage, inputting the detection signal to the control circuit 16, and causing the control circuit 16 to execute an appropriate control.

As a unit that monitors a capacitor voltage, the voltage detector 8 normally included in the power conversion device for controlling the power conversion device is used. The power conversion device according to the present embodiment can prevent the occurrence of a short circuit fault in the capacitor 5 in advance without adding any new detector by inputting a voltage detector output from the voltage detector 8 to the detection circuit 15.

The control unit 14 is explained next. The control unit 14 is configured to include the control circuit 16 and the detection circuit 15. The detection circuit 15 operates as a function of detecting the decrease in the impedance of the capacitor 5, and is described later in detail. The control circuit 16 receives a detection signal from the detection circuit 15, and controls the power conversion circuit 11 to stop a switching operation and the discharge circuit 10 to operate to discharge the energy accumulated in the capacitor 5. These operations are performed in response to the control signals output from the control circuit 16.

The detection circuit 15 shown in FIG. 2 operates as a function of detecting the decrease in the impedance of the capacitor 5, and is an example where software constitutes the detection circuit 15. For example, when the second switch 7 is turned off in a state where the power conversion circuit 11 and the discharge circuit 10 stop operating, the discharge resistor 9 discharges energy accumulated in the capacitor 5, and the voltage of the capacitor 5 decreases at a certain time constant.

A capacitor-voltage calculation circuit 12 shown in FIG. 2 calculates a capacitor voltage at which a discharge occurs when the capacitor 5 is normal with a condition of turning of this second switch 7 used as a trigger, by using a function expressed by, for example, $1 \div (1+ST)$. That is, the capacitor-voltage calculation circuit 12 estimates the capacitor voltage at which a discharged occurs when the capacitor 5 is normal. Note that symbol S denotes a Laplace operator and symbol T denotes a time constant obtained by multiplying a capacity C of the capacitor 5 by the resistance of the discharge resistor 9. For example, this estimated voltage has a value in a curve of the capacitor voltage represented by the solid line in FIG. 3. That is, the capacitor-voltage calculation circuit 12 estimates a transition of the voltage based on an initial voltage detected by the voltage detector 8 when the main circuit unit 1 is disconnected from a power supply and on the time constant described above.

A comparator 13 compares the transition of the voltage (hereinafter, "calculated value") estimated by the capacitor-voltage calculation circuit 12 with a transition of the voltage (hereinafter, "actual measurement value") detected by the voltage detector 8, and detects that the impedance of the capacitor 5 decreases when the actual measurement value is below the calculated value. The calculated value transmitted from the capacitor-voltage calculation circuit 12 is in the curve represented by the solid line in FIG. 3 and the actual measurement value is in a curve represented by a dotted line in FIG. 3, and accordingly, what the comparator 13 detects is a state where this dotted line is present below the solid line. When the actual measurement value is below the calculated value as described above, the detection circuit 15 outputs the detection signal indicating the sign before the occurrence of a short circuit in the capacitor 5 to the control circuit 16. At this time, the electric-discharge time constant for the capacitor voltage is set to a value such that the detection circuit 15 does not detect any abnormality when the filter capacitor 5 is normal in view of tolerances of the capacity of the capacitor 5 and a discharge resistance. Furthermore, it is preferable to take detection conditions into consideration so as not to erroneously detect any abnormality according to voltage changes other than that during the occurrence of the abnormality in the capacitor 5. For example, when the second switch 7 is turned on, when the discharge circuit 10 operates, or when the power conversion circuit 11 operates, the capacitor voltage often decreases to fall below the calculated value, and therefore mask processing is performed so as not to make protection and detection in those operation modes.

The control circuit 16 outputs the control signals, and controls the power conversion circuit 11 to promptly stop the switching operation and the discharge circuit 10 to operate to discharge the energy accumulated in the capacitor 5 when the control circuit 16 receives the detection signal from the detection circuit 15. As a result, it is possible to prevent the rupture of the case and a fire.

Alternatively, the detection circuit 15 can be configured to latch a detection state. For example, when the detection circuit 15 outputs a detection signal, there is a probability of the rupture of the capacitor case and it causes a fire. Therefore, it is preferable to prevent a stopped state of the power conversion circuit 11 from being unlocked and to prevent the power conversion circuit 11 from restarting unless a predetermined device that only specific operators can handle is connected to the power conversion device. By causing the detection circuit 15 to latch the detection state, it is possible to prevent the occurrence of a short circuit fault or the like in the capacitor 5 even if a driver, a conductor, or the like of an electric vehicle erroneously performs a protection unlocking operation. Furthermore, the function described above can more effectively suppress the occurrence of the rupture of the case and a fire caused by a short circuit fault that occurs in the capacitor 5.

Furthermore, the detection circuit 15 notifies an external device or using an indicator (not shown) that the detection circuit 15 has detected protection and that the power conversion circuit 11 is in the stopped state as a result of the protection detection by, for example, transmitting a predetermined signal to the external device or the indicator. This enables the operator to recognize that the power conversion circuit 11 is in a protected state, which can improve maintenance performance.

As described above, the power conversion device according to the present embodiment includes the detection circuit 15 that estimates a transition of a voltage (voltages during a normal state) based on an initial voltage detected by the voltage detector 8 when the main circuit unit 1 is disconnected from a power supply with a time of opening the second switch 7 as a trigger and on a time constant obtained from the value of the capacitor 5 and that of the discharge resistor 9, that compares the estimated voltage with a transition of a voltage (voltages during an abnormal state) detected by the voltage detector 8, and that generates a detection signal indicating a sign that a short circuit fault occurs in the capacitor 5. Therefore, it is possible to detect a decrease in the impedance of the capacitor 5 before the short circuit occurs in the capacitor 5, to stop the power conversion circuit 11, and to control the discharge circuit 10 to operate to promptly discharge the energy accumulated in the capacitor 5. As a result, it is possible to prevent in advance the occurrence of a short circuit fault in the capacitor 5 and the subsequent occurrence of the rupture of the capacitor case and the like. According to the conventional technique described in Patent Literature 2 mentioned above, when the detected capacitor voltage is equal to or lower than a predetermined value, the predetermined signal is output, thereby disconnecting the capacitor to which a short circuit fault occurs. Therefore, according to the conventional technique described in Patent Literature 2, it is impossible to detect the sign before the short circuit occurs in the capacitor. On the other hand, the power conversion device according to the present embodiment can detect the sign before the short circuit occurs in the capacitor.

Furthermore, the power conversion device according to the present embodiment latches a detection state. Therefore, it is possible to effectively suppress the occurrence of the rupture of the case and a fire caused by a short circuit fault that occurs in the capacitor 5 even if an operator or the like of an electric vehicle erroneously performs a protection release operation.

Second Embodiment

The control circuit 16 according to a second embodiment includes a function of forcibly turning off the second switch 7 at the time the power conversion circuit 11 stops when the second switch 7 is not turned off and the function of detecting a decrease in the impedance does not operate for a certain period of time (or a predetermined period of time). Therefore, it is possible to detect the decrease in the impedance of the capacitor 5 at an arbitrary timing. As a result, a sign of the short circuit that occurs in the capacitor 5 can be accurately detected, so that it is possible to more effectively prevent the rupture of the case of the capacitor 5 and a fire.

Third Embodiment

In a power conversion device that does not include the discharge resistor 9, when the capacitor 5 is normal, the electric charge of the capacitor 5 is gradually discharged by resistances of semiconductor elements of the power conversion circuit 11 connected between terminals of the capacitor 5, the voltage detector 8, and the like. On the other hand, when the capacitor 5 is abnormal, the impedance of the capacitor 5 decreases to about several kiloohms as described above. In the latter case, the electric charge of the capacitor 5 is discharged at a far smaller time constant than the electric-discharge time constant described in the first embodiment because of lack of the discharge resistor 9. Therefore, it is possible to promptly detect the abnormality of the capacitor 5 as compared with the power conversion device that includes the discharge resistor 9.

In this way, the power conversion device according to the present embodiment can detect a decrease in the impedance of the capacitor 5 and promptly detect the abnormality of the capacitor 5, similarly to the power conversion device according to the first embodiment, even when the power conversion device does not include the discharge resistor 9.

Fourth Embodiment

While each of the power conversion devices according to the first to third embodiments is configured to detect a decrease in the impedance of the capacitor 5 before a short circuit occurs in the capacitor 5, a power conversion device according to a fourth embodiment is configured to detect an instant decrease in the capacitor voltage.

Figure 4:
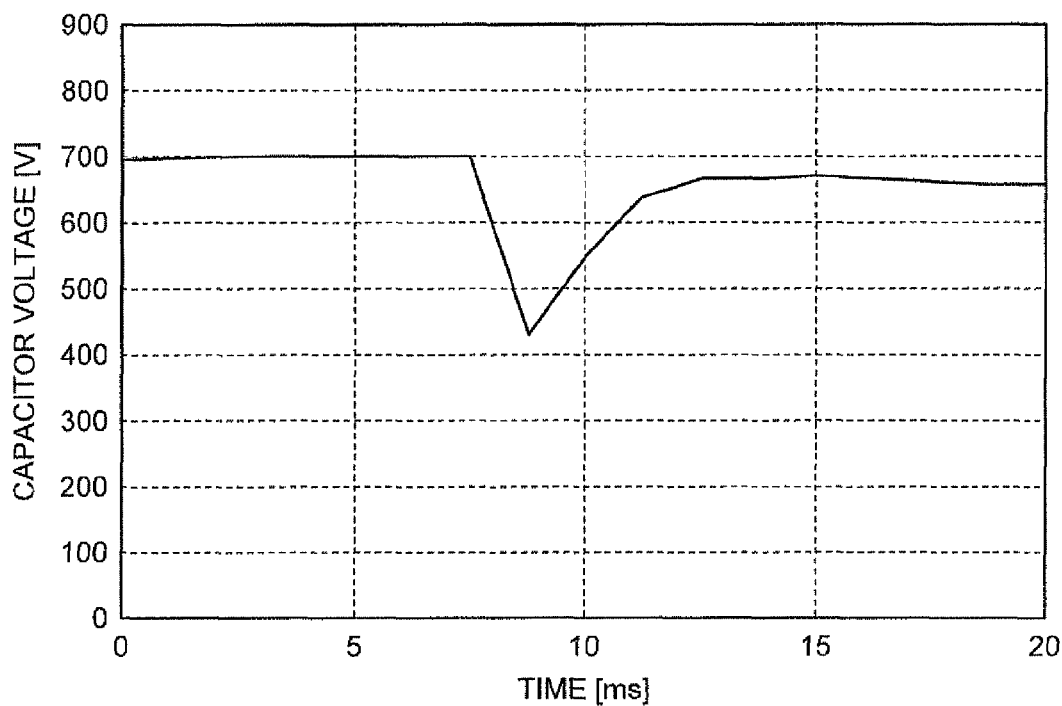
FIG. 4 depicts a change in a voltage of a capacitor into which a defect is mixed on purpose.
Figure 5:
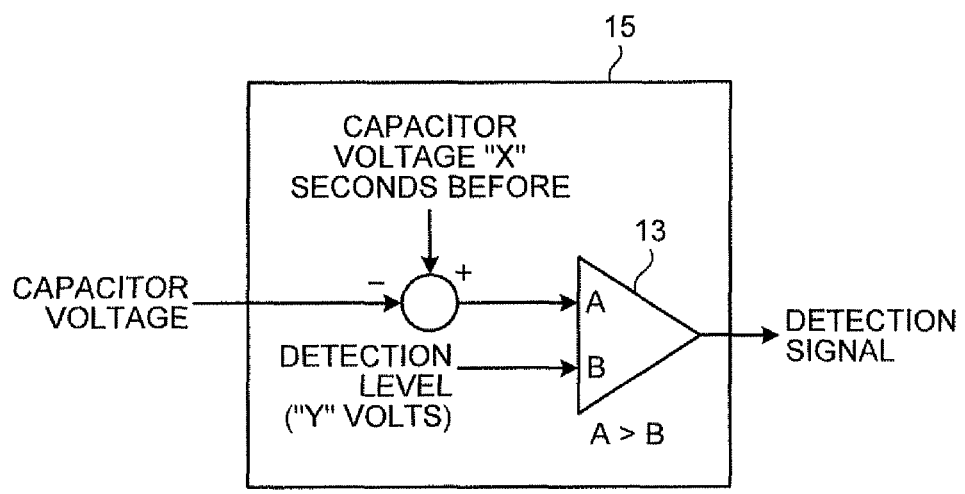
FIG. 5 is a configuration diagram of a detection circuit that is applied to a power conversion device according to a fourth embodiment of the present invention.

FIG. 4 depicts a change in a voltage of a capacitor into which a defect is mixed on purpose. FIG. 5 is a configuration diagram of a detection circuit that is applied to the power conversion device according to the fourth embodiment of the present invention. A result of an experiment confirmed that a local short circuit occurred in the capacitor 5 and an insulation recovery operation was performed on the capacitor 5 as a sign of the short circuit that occurs in the capacitor 5 other than the sign of the short circuit that occurs in the capacitor 5 as described in the first to third embodiments. In FIG. 5, it can be understood that a phenomenon occurs in the capacitor 5 that the capacitor voltage instantly decreases because of occurrence of the local short circuit in the capacitor 5 although the capacitor 5 is not completely short-circuited, insulation recovery follows the instant decrease in the capacitor voltage, and voltage recovery follows the insulation recovery by supply of the power from the power supply. The result of the experiment confirmed that the voltage of the capacitor 5 used in the experiment decreased by about 200 volts in about 1 millisecond. It was also confirmed that the capacitor 5 resulted in the complete short circuit after repeating such an operation several times.

Films that are dielectrics of the capacitor 5 have a so-called self-healing characteristic. This self-healing is a characteristic that deposited electrode metal evaporates by discharge energy generated during a short circuit and that insulation that electrodes locally lost recovers when insulation breakdown occurs to a part of the films. In FIG. 4, at a point at which the capacitor voltage changes, that is, a part at which the capacitor voltage drops from a steady state and rises again to be closer to the steady state, it is considered that a short circuit and healing occur to a local region of the films. By detecting that this instant decrease in the capacitor voltage, it is possible to prevent the occurrence of a short circuit fault in the capacitor 5 and the subsequent occurrence of the rupture of the case of the capacitor 5 and a fire.

As a unit that monitors the capacitor voltage, the voltage detector 8 normally included in the power conversion device for controlling the power conversion device is used. The power conversion device according to the present embodiment can prevent the occurrence of a short circuit fault in the capacitor 5 beforehand without adding any new detector by inputting the voltage detector output from this voltage detector 8 to the detection circuit 15.

The configuration of the detection circuit 15 according to the fourth embodiment is described next. The detection circuit 15 shown in FIG. 5 is an example in which software constitutes a circuit that detects the instant decrease in the capacitor voltage. FIG. 5 is a block diagram of a circuit that detects that the voltage decreases by "Y" volts for "X" seconds, for example. The detection circuit 15 shown in FIG. 5 constantly compares a capacitor voltage "X" seconds before with a current capacitor voltage, and detects that the capacitor voltage decreases by "Y" volts for "X" seconds when the decrease in the capacitor voltage is equal to or larger than the "Y" volts.

The configuration of the detection circuit 15 is explained with a specific example. For example, it is assumed that the current capacitor voltage is 500 volts, "X" seconds means 1 millisecond, the capacitor voltage "X" seconds before is 700 volts, and that "Y" volts is 100 volts. The detection circuit 15 calculates a difference (=200 volts) between the capacitor voltage "X" seconds before and the current capacitor voltage. The comparator 13 compares this difference with the "Y" volts, and detects the decrease in the impedance of the capacitor 5 and outputs the detection signal when the capacitor voltage decreases by "Y" volts for "X" seconds. That is, the detection circuit 15 according to the fourth embodiment generates a control signal indicating a sign of the occurrence of a short circuit fault in the capacitor based on a voltage decrease rate detected by the voltage detector 8 when the main circuit unit 1 is disconnected from the power supply. The configuration of the detection circuit 15 is not limited to the circuit configuration shown in FIG. 5, but any circuit is applicable to the detection circuit 15 as long as the circuit can detect that the capacitor voltage decreases by "Y" volts for "X" seconds.

The instant decrease in the capacitor voltage is a phenomenon that occurs just before the capacitor is broken. Accordingly, when the power conversion device is in a state where a voltage is applied to the capacitor 5, it is preferable to operate the detection circuit 15 constantly. However, to prevent the power conversion device from being stopped according to the decrease in the capacitor voltage during a normal operation, which is described later, it is necessary to set a detection level of the detection circuit 15 so that the detection circuit 15 does not erroneously detect the instant decrease in the capacitor voltage. Therefore, the detection circuit 15 measures first a voltage decrease rate when the instant short circuit occurs in the capacitor 5, and recognizes the voltage decrease rate (hereinafter, "voltage decrease rate A") during an actual instant short circuit. Furthermore, the detection circuit 15 recognizes a voltage decrease rate (hereinafter, "voltage decrease rate B") when the instant short circuit does not occur in the capacitor 5 and the power conversion device normally operates. Further, the detection level of the detection circuit 15 is set between the voltage decrease rate A and the voltage decrease rate B. That is, in the detection circuit 15, the detection level at which the voltage detector 8 detects the instant decrease in the voltage is set between the voltage decrease rate when the instant short circuit occurs in the capacitor 5 and the voltage decrease rate that possibly occurs when the voltage conversion device normally operates.

In a case of an electric vehicle directly connected to an aerial line, various external factors for a change in the capacitor voltage are present. Therefore, it is important to extract the factors for the decrease in the voltage when the power conversion device operates normally and to recognize the voltage decrease rate in that case so as to prevent a protection device from erroneously detecting an abnormality. The factors for the decrease in the capacitor voltage during the normal operation are considered to include oscillation in the capacitor voltage due to a sudden change in an aerial line voltage, a sudden decrease in the capacitor voltage due to grounding of the aerial line such as an accident, and the decrease in the capacitor voltage due to blackout of the aerial line while the power is being supplied to the load 4. The detection level of the detection circuit 15 according to the present embodiment is set between the voltage decrease rate B under those conditions and the voltage decrease rate A when the instant short circuit actually occurs in the capacitor. With this setting, it is possible to realize a protecting function that enables a detecting function to constantly operate, that does not erroneously detect an abnormality other than the abnormality of the capacitor 5, and that can detect the abnormality only when the instant short circuit occurs in the capacitor 5.

The instant decrease in the capacitor voltage is a phenomenon just before the occurrence of the short circuit in the capacitor 5. Accordingly, when receiving the detection signal from the detection circuit 15, the control circuit 16 outputs the control signals, promptly stops the power conversion circuit 11, and controls the discharge circuit 10 to operate to discharge the energy accumulated in the capacitor 5. Furthermore, similarly to the first embodiment, the detection circuit 15 latches a detection state and notifies an external device or an indicator (not shown) of the protection detection so that the power conversion device cannot be operated.

As described above, the power conversion device according to the preset embodiment sets the detection level at which the detection circuit 15 detects an instant decrease in the capacitor voltage between the voltage decrease A during the occurrence of the instant short circuit in the capacitor 5 and the voltage decrease B that possibly occurs during the normal operation. Therefore, the power conversion device can detect only the instant short circuit that occurs in the capacitor 5. As a result, it is possible to further improve reliability as compared with the power conversion device according to the first embodiment.

The detection circuit 15 according to the present embodiment can be configured to hold the detection state of detecting the voltage decrease similarly to the detection circuit 15 according to the first embodiment. Furthermore, similarly to the control circuit 16 according to the second embodiment, the control circuit 16 according to the present embodiment can be configured to forcibly turn off the second switch 7 at the time the power conversion device 11 stops operating if the second switch 7 is not turned off and the detecting function of detecting the decrease in the impedance does not operate for a predetermined period of time.

Fifth Embodiment

The discharge circuit 10 is intended to discharge energy accumulated in the capacitor 5 in a short time and to decrease a capacitor voltage when the capacitor 5 is abnormal. Therefore, it is necessary to deal with a possibility that a voltage decrease rate (hereinafter, "voltage decrease rate C") when the discharge circuit 10 operates is substantially equal to the voltage decrease rate A during the occurrence of an instant short circuit in the capacitor 5, depending on settings of the discharge circuit 10. In this case, if a protection operation is performed as a result of a factor other than the occurrence of the instant short circuit in the capacitor 5 and the protection operation causes the discharge circuit 10 to perform discharging, the detection circuit 15 possibly and erroneously detects that an instant short circuit occurs in the capacitor 5 although the capacitor 5 is normal. That is, the voltage detector 8 also detects the capacitor voltage when the discharge circuit 10 operates, and if the voltage decrease rate C is substantially equal to the voltage decrease rate A, the detection circuit 15 erroneously detects the occurrence of the instant short circuit in the capacitor 5. As a result, the control circuit 16 often stops the power conversion device 11 in response to the control signal from the detection circuit 15.

To prevent such erroneous detection, the detection circuit 15 according to a fifth embodiment includes a function of masking the detecting function of detecting the occurrence of the instant short circuit in the capacitor 5 based on a predetermined instruction from the control circuit 16 when the protection operation is performed because of the factor other than the occurrence of the instant short circuit in the capacitor 5 and the protection operation causes the discharge circuit 10 to operate. That is, the detection circuit 15 according to the fifth embodiment masks the detecting function of detecting the voltage decrease only when the voltage decrease rate when the discharge circuit 10 operates according to the factor other than the instant short circuit to the capacitor 5 is substantially equal to the voltage decrease rate during the occurrence of the instant short circuit in the capacitor 5. This can avoid the erroneous detection described above even when the discharge circuit 10 operates although the instant decrease in the capacitor voltage does not occur. As a result, it is possible to prevent the erroneous detection from stopping the power conversion device and to control the power conversion circuit 11 to continuously operate.

Alternatively, instead of using software, discrete electronic components can constitute the detection circuit 15 according to the first to fifth embodiments. In this case, it is possible to achieve similar effects to those of the first to fifth embodiments and to reduce a processing load on the control unit 14. Furthermore, while the present invention has been explained while referring to a case where the invention is applied to a power conversion device for an electric vehicle as an example, the present invention is also applicable to any type of power conversion devices as long as it is configured so that the DC main circuit unit 1 includes the capacitor 5, and such a power conversion device can prevent occurrence of a short circuit fault in a capacitor.

INDUSTRIAL APPLICABILITY

As described above, the present invention can be applicable to a power conversion device that includes a DC circuit unit, and is particularly useful as an invention that can suppress degradation of functions and improve efficiency of maintenance work.

REFERENCE SIGNS LIST

1 main circuit unit
2 power collector
3 first switch
4 load
5 filter capacitor
6 filter reactor
7 second switch
8 voltage detector
9 discharge resistor
10 discharge circuit (second discharge circuit)
11 power conversion circuit
12 capacitor-voltage calculation circuit
13 comparator
14 control unit
15 detection circuit
16 control circuit
20 inrush-current suppression unit

The invention claimed is:

1. A power conversion device comprising:
a direct-current main circuit that converts direct-current power into alternating-current power; and
a control unit that controls the direct-current main circuit, wherein
the direct-current main circuit includes
a capacitor that constitutes the direct-current main circuit, a detector that detects a voltage of the capacitor, and a first discharge circuit that includes the capacitor and a first resistor, and that discharges electric charge accumulated in the capacitor via the first resistor, and
the control unit includes a detection circuit that compares a transition of a voltage estimated based on an initial voltage detected by the detector at a time of disconnecting the direct-current main circuit from a power supply and on a time constant of the first discharge circuit with a transition of a voltage detected by the detector, and that generates a detection signal indicating a sign that a short circuit fault occurs in the capacitor, and the control unit disconnects the direct-current main circuit from the power supply when the direct-current main circuit is not disconnected from the power supply for a predetermined period of time.

2. The power conversion device according to claim 1, wherein
the direct-current main circuit includes a second discharge circuit that includes a second resistor and that discharges electric charge accumulated in the capacitor via the second resistor, and the control unit includes a control circuit that controls the second discharge circuit to operate when the control circuit receives a detection signal from the detection circuit.

3. A power conversion device comprising:
a direct-current main circuit that converts direct-current power into alternating-current power; and
a control unit that controls the direct-current main circuit, wherein
the direct-current main circuit includes
a capacitor that constitutes the direct-current main circuit, a detector that detects a voltage of the capacitor, and a first discharge circuit that includes the capacitor and a first resistor, and that discharges electric charge accumulated in the capacitor via the first resistor, and
the control unit includes a detection circuit that generates a detection signal indicating a sign that a short circuit fault occurs in the capacitor based on a gradient of an instant decrease for a period of time since the voltage detected by the detector at a time of disconnecting the direct-current main circuit from a power supply drops from a steady state until the voltage detected by the detector rises again to be closer to the steady state.

4. The power conversion device according to claim 3, wherein a detection level of the detection circuit at which the detection circuit detects the instant decrease in the voltage detected by the detector is set between a voltage decrease rate during occurrence of the instant short circuit in the capacitor and a voltage decrease rate that possibly occurs during a normal operation.

5. The power conversion device according to claim 3, wherein
the direct-current main circuit includes a second discharge circuit that includes a second resistor and that discharges electric charge accumulated in the capacitor via the second resistor, and
the detection circuit masks a detecting function of detecting a decrease in the voltage only when a voltage decrease rate when the second discharge circuit operates is substantially equal to a voltage decrease rate during occurrence of an instant short circuit in the capacitor.

6. The voltage conversion device according to claim 1, wherein the detection circuit latches a detection state when the detection circuit detects an abnormality of the capacitor.

7. The power conversion device according to claim 1, wherein the detection circuit notifies outside that the detection circuit has detected a sign that a short circuit fault occurs in the capacitor.

8. The power conversion device according to claim 1, wherein the control circuit disconnects the direct-current main circuit from a power supply when the direct-current main circuit is not disconnected from the power supply for a predetermined period of time.

9. The power conversion device according to claim 3, wherein the detection circuit latches a detection state when the detection circuit detects an abnormality of the capacitor.

10. The power conversion device according to claim 3, wherein the detection circuit notifies outside that the detection circuit has detected a sign that a short circuit fault occurs in the capacitor.

* * * * *